United States Patent
Morich et al.

(10) Patent No.: US 6,538,443 B2
(45) Date of Patent: Mar. 25, 2003

(54) MRI GRADIENT COIL WITH VARIABLE FIELD OF VIEW AND APPARATUS AND METHODS EMPLOYING THE SAME

(75) Inventors: Michael A. Morich, Mentor, OH (US); Shmaryu M. Shvartsman, Highland Heights, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/813,183

(22) Filed: Mar. 20, 2001

(65) Prior Publication Data

US 2002/0171424 A1 Nov. 21, 2002

(51) Int. Cl.$^7$ ................................................ G01V 3/00
(52) U.S. Cl. ....................... 324/318; 324/309; 324/320
(58) Field of Search ................................ 324/320, 319, 324/318, 322, 309, 307, 306, 300, 321; 600/410, 419

(56) References Cited

U.S. PATENT DOCUMENTS

| | | | | |
|---|---|---|---|---|
| 4,617,516 A | | 10/1986 | Schenck | 324/318 |
| 4,670,716 A | | 6/1987 | Kunz | 324/309 |
| 4,978,920 A | | 12/1990 | Mansfield | 324/318 |
| 5,311,135 A | | 5/1994 | Vavrek et al. | 324/318 |
| 5,349,297 A | | 9/1994 | DeMeester | 324/318 |
| 5,736,858 A | | 4/1998 | Katznelson | 324/318 |
| 5,877,629 A | * | 3/1999 | King et al. | 324/309 |
| 5,952,830 A | * | 9/1999 | Petropoulos | 324/318 |
| 6,049,207 A | | 4/2000 | Petropoulos | 324/318 |
| 6,236,208 B1 | * | 5/2001 | Ham et al. | 324/318 |
| 6,278,275 B1 | * | 8/2001 | Petropoulos et al. | 324/318 |
| 6,297,635 B1 | * | 10/2001 | Arz et al. | 324/318 |
| 6,313,630 B1 | * | 11/2001 | Ganin et al. | 324/312 |
| 6,342,787 B1 | * | 1/2002 | Petropoulos et al. | 324/320 |
| 6,479,999 B1 | * | 11/2002 | DeMeester et al. | 324/318 |
| 2002/0171424 A1 | * | 11/2002 | Morich et al. | 324/318 |

FOREIGN PATENT DOCUMENTS

| | | |
|---|---|---|
| DE | 19955117 | 5/2001 |
| WO | WO 00/23812 | 4/2000 |

OTHER PUBLICATIONS

Kimmlingen, et al., "Gradient System With Continuously Variable Field Characteristics", Proceed. Of the ISMRM, 8$^{th}$ Scientific Meeting, Denver, CO Apr. 1–7, 2000, vol. 1, p. 332 XP002209875.

Harvey, et al., "Modular Gradient Coil: A New Concept in High–Performance Whole–Body Gradient Coil Design", Magnetic Resonance in Medicine, vol. 42, No. 3, Sep. 1999, pp. 561–570, XP000859169.

Kimmlingen, et al. "Gradient System with Continuously Variable Field Characteristics", Proceedings of the ISMRM, Denver, Apr. 2000.

* cited by examiner

Primary Examiner—Edward Lefkowitz
Assistant Examiner—Tiffany A. Fetzner
(74) Attorney, Agent, or Firm—Fay, Sharpe, Fagan, Minnich & McKee, LLP

(57) ABSTRACT

A gradient coil assembly (22) generates magnetic field gradients across the main magnetic field of a magnetic resonance imaging apparatus and includes a base gradient coil set which generates magnetic field gradients which are substantially linear over a first useful imaging volume, and a correction gradient coil set which generates magnetic field gradients having substantially no first order moment. The correction gradient coil set produces third and higher order moments which combine with higher order terms of the base gradient coil set to produce magnetic field gradients which are substantially linear over a second useful imaging volume different from the first useful imaging volume. In a preferred embodiment, the second volume is continuously variable by adjusting the amounts of current applied to the base and correction coils.

20 Claims, 15 Drawing Sheets

MRI GRADIENT COIL WITH VARIABLE FIELD OF VIEW AND APPARATUS AND METHODS EMPLOYING THE SAME

BACKGROUND OF THE INVENTION

The present invention relates to the magnetic resonance arts. It finds particular application in conjunction with medical magnetic resonance imaging and will be described with particular reference thereto. It is to be appreciated, however, that the invention also finds application in conjunction with other types of magnetic resonance imaging systems, magnetic resonance spectroscopy systems, and the like.

In magnetic resonance imaging, linear magnetic field gradients are used for spatial encoding. Gradient coils are used to produce the linear magnetic field gradients. Gradient coils are generally designed to provide an imaging field-of-view (FOV) which is fixed in size. For example, in whole-body applications the gradient coil will typically be designed to produce sufficiently linear or uniform magnetic field gradients over a 45–50 cm diameter spherical volume (DSV). For a dedicated cardiac scanner, however, the DSV may be 35–40 cm. For a dedicated head system the linear gradients would be designed to produce sufficiently linear magnetic field gradients over a 20–25 cm DSV. As the useful DSV is made smaller the stored energy of the gradient coil is reduced, which allows for higher performance, namely, higher peak gradient strengths and faster gradient coil switching. Outside the substantially linear region of the gradient field (i.e., the "useful" DSV), and to a lesser extent within, the magnetic field gradients produce image distortion. Software-based distortion correction schemes have been developed to correct for nonuniformities within the useful DSV, as well as to expand somewhat the useful imaging FOV.

In each dedicated case noted above, the gradient coil is generally a unique electromechanical structure and gradient coils with a defined DSV are known and utilized throughout the industry. For example, the most common is a self-shielded symmetric gradient coil design for whole-body imaging applications. Dedicated head and cardiac/head coil designs have emerged to enhance performance (peak strength and switching rate) over a reduced imaging DSV. Generally, body access is desirable for patient comfort reasons, although dedicated head gradient designs continue to be discussed for advanced neuro/brain research applications.

Gradient coils are heavy electromechanical devices, unlike an RF surface coil which can be easily removed and replaced with a different RF surface coil between imaging procedures. A gradient coil, due to its high power nature, tends to be a fixed entity within an MRI system. As such, a dedicated gradient coil tends to make the MRI system a dedicated imaging system, limiting its scope of clinical application. Thus, accommodating both large and small FOV applications has generally required either separate dedicated machines, which is expensive, or the use of dedicated insertable coils for the smaller volumes, which are heavy and difficult to insert or replace.

More recently, dual or twin gradient designs have been described in the literature which attempt to combine both large volume and high-performance small volume imaging capabilities into a single gradient coil electromechanical package. Katznelson et al., in U.S. Pat. No. 5,736,858, describe a means for providing two gradient coils which can be configured to allow for two different useful DSVs. Each gradient axis, x, y, and z, has two gradient coils. One gradient coil is designed to produce a linear magnetic field gradient over a first DSV, and a second gradient coil is designed to produce a second linear magnetic field gradient, such that when the second gradient coil is driven in series with the first gradient coil, there results a second DSV that is larger than the first DSV. In this scheme, the DSV can take two discrete values but it is not continuously variable. The first gradient coil has lower stored energy and can be switched faster than the second gradient coil alone or when the two gradient coils are connected in series. In another embodiment, the first coil produces a gradient for use in small FOV applications and the second coil produces a gradient for use in conventional, large FOV applications and a single amplifier means and a switching means allows for one or the other coil to be used separately. In the preferred embodiment, the first coil is used for fast-switching, small FOV imaging and both coils together are used for larger FOV imaging and/or to produce very high gradient strengths, which may find use in diffusion imaging applications. A key point is that each coil is designed so as to produce, alone or in combination, a linear gradient magnetic field over one of two possible imaging DSVs. In the preferred embodiment the two coils are used together (in series) to produce a relatively large DSV. In the alternate embodiment, each coil can be used individually to create reasonably non-distorted magnetic resonance images over two differently sized DSVs. Katznelson et al. do not teach that the second gradient coil be preferentially configured/designed to produce substantially zero first-order gradient. Furthermore, each coil is self-shielded or actively-shielded in design to minimize eddy current effects. Since each coil produces its own linear gradient magnetic field, a drawback of this approach is that two full-power gradient coils are housed within one electromechanical assembly. This consumes a great deal of radial space, particularly when the two coils occupy different radial positions within the electromechanical structure. Each coil must have sufficient conductor cross-section to carry similar high currents. Also, cooling of the two coils becomes an issue, as does the ability to fit in other components such as passive and electrical shim coils.

It has also been proposed by Kimmlingen et al. ("Gradient system with continuously variable field characteristics," ISMRM 2000 (April, 2000, Denver meeting)) to take a standard whole body coil with a large field of view and identify a subset of the coil windings which would produce a linear gradient in a smaller FOV, but with comparable (about 20% less) peak gradient strength and substantially lower inductance (about 45% less), allowing for faster gradient switching. Switching means or a dual amplifier design, to feed both coil sections separately, would be provided such that either the subset or all of the windings could be utilized, and the amount of current to subset or other windings could be adjustable, depending on the size of the FOV. The primary advantage is that the two coils occupy the same radial position with the normal six layers, making cooling and construction easier and more cost-effective. A disadvantage of this approach is that when some of the coil windings were taken away to provide for the smaller FOV, some gradient strength was lost. Another disadvantage is that shielding was compromised since only the combined coils were optimally shielded, leading to increased eddy current effects.

Petropoulos, in U.S. Pat. No. 6,049,207, describes a dual gradient coil assembly with two primary coils and one common shield coil. Each primary coil produces a linear magnetic field gradient over differently sized DSVs when operated with the common shield coil. The residual eddy current effects are not equal for the two coils, one inevitably is better than the other. However, this is minimized by constraining each continuous current primary coil and common shield coil combination to have an integer number of turns before discretization. The approach of having one common shield does save some radial space for manufacture. However, two high power primary coils are still required.

It is also known in the art to use relatively low current/power shim coils to improve the uniformity of the main magnetic field. However, such shim coils are generally designed to produce predominantly one order of correction, for example, a Z2 shim coil provides primarily a second-order correction field, a physically separate Z3 shim coil a third-order correction field, and so on.

The present invention contemplates a new and improved gradient coil system which provides a variable imaging field of view, and which overcomes the above referenced problems and others.

SUMMARY OF THE INVENTION

In a first aspect of the present invention, a magnetic resonance imaging apparatus includes a main magnet system for generating a main magnetic field through an examination region, a radio frequency coil disposed adjacent the examination region for transmitting radio frequency signals into the examination region and selectively exciting dipoles disposed therein, and a radio frequency transmitter for driving the radio frequency coil. A receiver receives magnetic resonance signals from resonating dipoles within the examination region and an image processor reconstructs an image representation from the received magnetic resonance signals for display on a human readable display.

The apparatus further includes a gradient coil assembly for generating magnetic field gradients across the main magnetic field. The gradient coil assembly includes a base gradient coil set disposed about the examination region including an array of conductive coil loops arranged such that a current density flowing thereon generates magnetic field gradients which are substantially linear over a first useful imaging volume. The gradient coil assembly further includes a correction gradient coil set disposed about the examination region including an array of conductive coil loops arranged such that a current density flowing thereon generates magnetic field gradients having substantially no first order moment. The correction gradient coil set produces third and higher order moments which combine with higher order terms of the base gradient coil set to produce magnetic field gradients which are substantially linear over a second useful imaging volume which is different from the first useful imaging volume when the correction gradient coil set is used in combination with the base gradient coil set.

In another aspect, a gradient coil assembly for inducing magnetic field gradients across an examination region in a magnetic resonance imaging apparatus is provided. The gradient coil assembly includes a base gradient coil set disposed about the examination region including an array of conductive coil loops arranged such that a current density flowing thereon generates the substantially linear magnetic field gradients which are substantially linear over a first imaging volume and nonlinear outside of the first imaging volume, and a correction gradient coil set disposed about the examination region including an array of conductive coil loops arranged such that a current density flowing thereon generates a magnetic field gradient having third and higher order terms and substantially no first order term, the third and higher order terms combining with higher-order terms of the base gradient coil set to produce magnetic field gradients which supplement the nonlinear gradient surrounding the first imaging volume to increase the imaging volume over which the gradient is linear from the first imaging volume to a second imaging volume.

In still a further aspect, a method of magnetic resonance imaging comprises: generating a temporally constant magnetic field through an examination region of a magnetic resonance imaging apparatus, exciting and manipulating magnetic resonance in selected dipoles in the examination region, demodulating magnetic resonance signals received from the examination region, reconstructing the demodulated resonance signals into an image, and, in appropriate time sequence to the above actions, inducing gradient magnetic fields across the temporally constant magnetic field with a gradient coil assembly. The gradient coil assembly comprises a base gradient coil set disposed about the examination region including an array of conductive coil loops arranged such that a current density flowing thereon generates the substantially linear magnetic field gradients defining a first useful imaging volume, and a correction gradient coil set disposed about the examination region including an array of conductive coil loops arranged such that a current density flowing thereon generates substantially no linear magnetic gradient. The correction gradient coil set produces third and higher order and substantially no first order gradient. The third and higher order gradients combine with higher-order terms of the base gradient coil set to produce the substantially linear magnetic field gradients defining a second useful imaging volume which is different from the first useful imaging volume when the correction gradient coil set is used in combination with the base gradient coil set.

In yet a further aspect, in a method of magnetic resonance imaging, a method of producing a magnetic field gradient which is generally linear over a selected imaging volume comprises configuring a base gradient coil to produce a first magnetic field gradient in response to supplying a first current to the base gradient coil, the first magnetic field gradient being generally linear over a first useful imaging volume, the first magnetic field gradient increasing proportionally with the supplied current, and configuring a correction coil to produce a second magnetic field gradient in response to supplying a second current to the correction coil, the second magnetic field gradient having substantially no first order moment, the second magnetic field gradient combining with the first magnetic field gradient to generate a combined magnetic field gradient which is generally linear over a second useful imaging volume.

In still another aspect, a method of designing a gradient coil system for a magnetic resonance imaging system having a variable useful imaging diameter spherical volume, comprises designing a base coil that produces a first magnetic field gradient that is generally linear over a first imaging volume, and designing a correction coil that produces a second magnetic field gradient having substantially zero first order moment, the first and second magnetic field gradients combining to produce a third magnetic field gradient that is generally linear over a second imaging volume that is different from the first imaging volume.

It will be recognized that a coil with zero first order gradient represents the ideal case and the term "substantially zero first order" as used herein is not intended to preclude a minimal first order gradient. Likewise, the term "substantially linear" as used herein is not intended to preclude small nonlinearities or nonuniformities in the gradient fields.

One advantage of the present invention is that gradient fields with linear regions of variable spatial extent can be generated to accommodate both large volume imaging applications and small volume imaging applications requiring fast gradient coil switching and high peak gradient strengths.

Another advantage is that the linear region of the gradients can be tailored to the region of interest, thus reducing the potential for peripheral nerve stimulation in an examination subject.

Another advantage is that the variable field of view is accomplished by providing a correction coil which generates a substantially zero first order gradient field and which therefore carries much less current than would be required for a second coil producing a linear gradient field.

Still further advantages of the present invention will become apparent to those of ordinary skill in the art upon reading and understanding the following detailed description of the preferred embodiments.

BRIEF DESCRIPTION OF THE DRAWINGS

The invention may take form in various steps and arrangements of steps and in various components and arrangements of components. The drawings are only for purposes of illustrating the preferred embodiments and are not to be construed as limiting the invention.

DETAILED DESCRIPTION OF THE PREFERRED EMBODIMENTS

Figure 1:
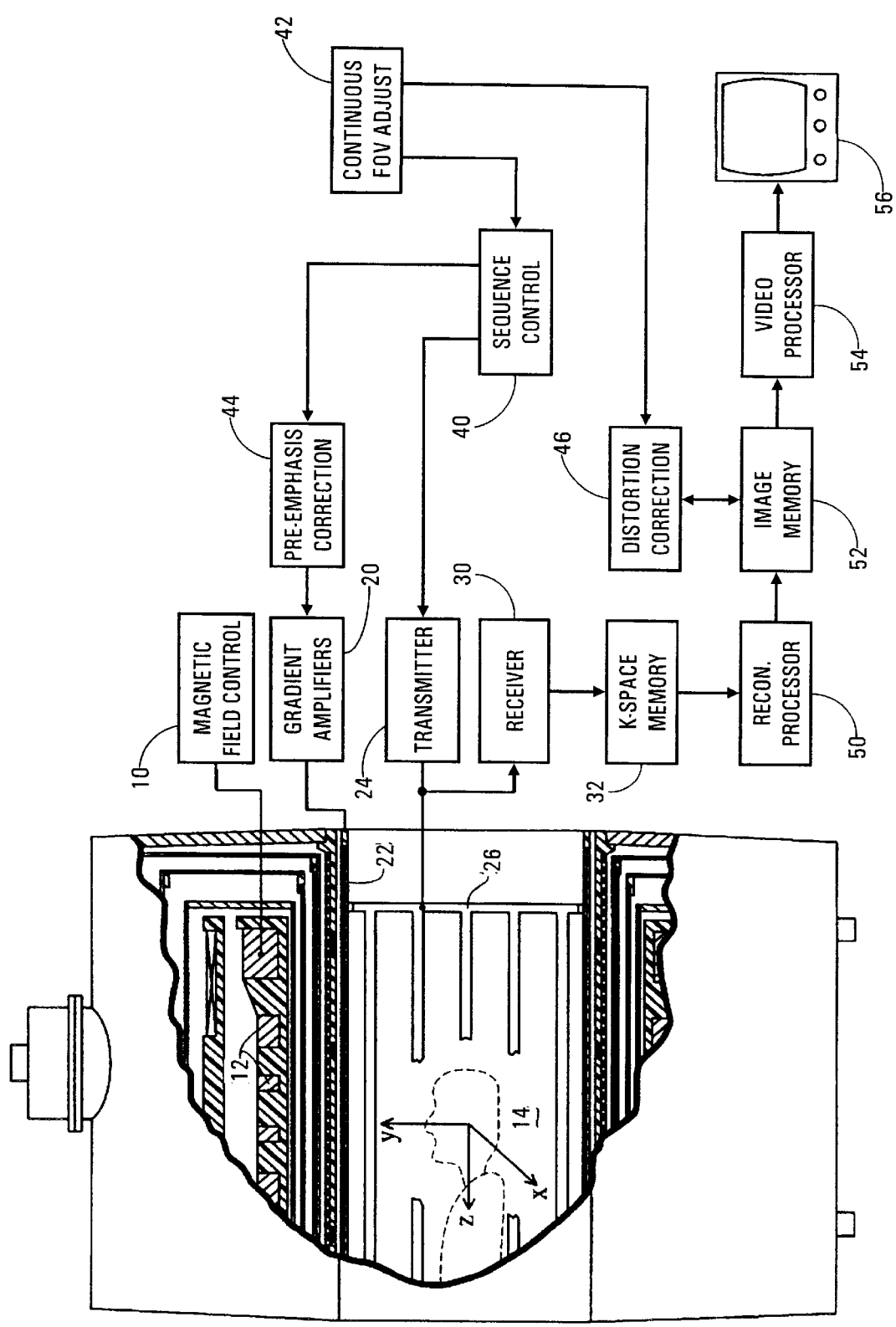
FIG. 1 is a diagrammatic illustration of a magnetic resonance imaging apparatus including a variable FOV gradient coil assembly in accordance with the present invention.

With reference to FIG. 1, a main magnetic field control 10 controls superconducting or resistive magnets 12 such that a substantially uniform, temporally constant main magnetic field $B_0$ is created along a z-axis through an examination region 14. Although a bore-type magnet is illustrated in FIG. 1, the present invention is equally applicable to open magnet systems and other known types of MRI scanners. A couch (not illustrated) suspends a subject to be examined within the examination region 14. A magnetic resonance echo generation system applies a series of radio frequencies (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like, to generate magnetic resonance imaging and spectrography sequences. More specifically, gradient pulse amplifiers 20 apply current pulses to selected ones or pairs of gradient coil assemblies 22 to create magnetic field gradients along x, y, and z axes of the examination region 14. A digital radio frequency transmitter 24 transmits radio frequency pulses or pulse packets to a whole-body RF coil 26 to transmit RF pulses into the examination region. A typical radio frequency pulse is composed of a packet of immediately contiguous pulse segments of short duration which taken together with each other and any applied gradients achieve a selected magnetic resonance manipulation. For whole-body applications, the resonance signals are commonly picked up by the whole-body, or other suitable close-fitting, RF coil 26. For generating images of local regions of the subject, specialized radio frequency coils are placed continuous to the selected region. For example, an insertable RF coil may be inserted surrounding a selected region at the isocenter of the bore. The insertable RF coil is used to excite magnetic resonance and receive magnetic resonance signals emitting from the patient in the region being examined. Alternatively, the insertable RF coil can be used to only receive resonance signals introduced by whole-body coil RF transmissions. The resultant radio frequency signals are picked up by the whole-body RF coil 26, the insertable RF coil, or other specialized RF coils and demodulated by a receiver 30, preferably a digital receiver.

A sequence control circuit 40 controls the gradient pulse amplifiers 20 and the transmitter 24 to generate any of a plurality of multiple echo sequences such as echo planar imaging, echo volume imaging, gradient and spin echo imaging, fast spin echo imaging, and the like. Following each RF excitation pulse, the resonance signals are amplified and demodulated by the receiver 30 and sampled into a k-space data memory 32. The received data are reconstructed into an image representation by a reconstruction processor 50 which applies a two-dimensional Fourier transform or other appropriate reconstruction algorithm. The image may represent a planar slice through the patient, an array of parallel planar slices, a three-dimensional volume, or the like. The image is then stored in an image memory 52 where it may be accessed by a video processor 54 that formats the image data for display on a human-viewable display, such as a video monitor 56.

The gradient coil assembly 22 includes a base gradient coil design having a first useful DSV, designated DSV1. That is, the base coil generates a gradient that is substantially linear over DSV1 but rolls off or otherwise becomes non-linear outside of DSV1. The gradient coil assembly 22 further includes a correction or shim gradient coil design which produces fields that add to those of the first gradient coil design, such that the useful DSV is expanded to a second useful DSV, designated DSV2, where DSV2 >DSV1. More specifically, the correction coil adjusts the nonlinear base coil gradients outside of DSV1 to make them substantially linear out to DSV2. In alternate embodiments, it is contemplated that DSV2<DSV1, for example, by reversing the current direction in the correction gradient coil. Unique to the gradient coil system of the present invention is that the correction gradient coil design produces substantially zero first-order gradient. Instead, the correction gradient coil design produces a combination of third and higher spatial order gradients which combine with the higher-order terms of the base gradient coil design. In this manner, the imaging DSV is expanded by improving the linearity/uniformity so as to expand the useful imaging DSV when the correction gradient coil design is used. By using variable amounts of the correction coil fields, the useful DSV can be made variable over a range of imaging volumes.

As an example, gradient coils are generally designed to produce an acceptably linear gradient field over a DSV of about 45–50 cm for human whole-body imaging. Spatial non-linearity or non-uniformity of the gradient field manifests as image distortion. In accordance with the present invention, a base gradient coil is designed with a smaller useful DSV which has certain advantages (e.g., lower stored energy and thus ability to be switched faster) for imaging anatomy or structures which require a smaller DSV1, such as the brain or heart. In one preferred embodiment, this DSV1 is about 20–25 cm. A correction coil which corrects the nonlinear field between DSV1 and a larger DSV2 is calculated. The correction coil generates a substantially zero first order gradient field which partially compensates the spatial non-linearity of the base gradient coil so as to increase/expand the useful imaging volume from DSV1 to DSV2. The base gradient coil and correction coil, together, have higher stored energy than the base coil alone, as is also generally the case for larger DSV coil designs.

The correction coil design can be selected by a number of methods. However, regardless of the design method, it is preferred that both the base coil design and the correction coil design be well-shielded to minimize eddy current effects when used over the possible range of DSVs. For example, target field and energy minimization methods, with constraints, are used to arrive at base or correction coil solutions in one embodiment. As another example, the correction coil current distribution is arrived at by subtraction of the current distributions for coils producing linear gradient volumes DSV1 and DSV2. In this scheme, the first step is to determine the currents which produce DSV1 and DSV2 with the gradient strength set at that value desired for the largest DSV, e.g., a gradient strength of 27 mT/m. The difference in these currents defines a correction current distribution having substantially zero gradient strength. When added to the base coil at 27 mT/m the result is the original 27 mT/m gradient with a larger DSV. If the strength of the gradient is to be varied without affecting the useful DSV, then the currents are varied proportionally. It is possible to discretize the smaller DSV current or base coil such that the desired gradient strength for the smaller DSV is obtained with the available peak current, e.g., 50 mT/m. The only effect this has is that the discrete base coil utilizes less current when operated at 27 mT/m.

The base coil and correction coil occupy different radial positions. However, the correction coil uses substantially less current to operate as compared to a complete linear gradient coil. Thus, it can utilize less conductor cross-section to allow more space efficiency, e.g., for water-cooling.

A DSV selection means, Continuous FOV Adjust, 42 is provided to allow the operator to select the FOV. This is performed, for example, during a "pilot" or "adjustment" procedure performed prior to a given scanning experiment. The DSV selection is made by an operator through a user interface of a type through which other scanning parameters, such as contrast, resolution, and so forth, are input as well. In this manner, the DSV is tailored to the anatomy or region being imaged.

One method of enhancing image quality in MR imaging applications is through the use of distortion correction which compensates for gradient nonlinearities, e.g., performed in software on the resultant images. The distortion correction depends on the gradient coil characteristics. However, with a variable FOV gradient coil in accordance with the present invention, such gradient coil characteristics tend to vary in accordance with the selected FOV. Thus, in a preferred embodiment, a variable electronic image distortion correction algorithm is utilized. Spherical harmonics, a Taylor expansion series, or the like, is used to describe the image distortion due to the gradient coil characteristics. The coefficients or model for the correction are based on the actual combination characteristics of the combined base and correction coil used for the particular imaging procedure. Thus, the correction factors vary depending on how much of the correction coil and how much of the base coil field is used, which depends on the FOV or imaging DSV being used, which in turn depends on the specific imaging procedure or anatomy. Thus, an optional variable or adaptive distortion correction processor 46 is advantageously provided to correct for gradient distortion characteristics which vary as a function of the selected DSV.

The gradient nonlinearity/nonuniformity characteristics over the range of imaging volumes are measured or calculated in advance. The data obtained are used for correction of the reconstructed image data. For example, distortion correction coefficients/models over the selectable DSV range are precalculated and stored for later use in a look up table preprogrammed in accordance with the relative amounts of current in the base coil and the correction coil.

Another method for improving image quality is to provide eddy current correction. Because transient gradient techniques are typically used, magnetic couplings are produced between the gradient coils and nearby conductive materials, such as conductive structures of the imaging apparatus. Such magnetic couplings produce eddy current induced residual fields which degrade the gradient magnetic field. Typically, a pre-emphasis filter is employed to predistort the current pulse such that the amplified current pulse together with the eddy current effects produces the desired output field. Eddy current effects vary with spatial position within the imaging DSV, e.g., the optimum eddy current correction over the brain will generally be different than the optimal eddy current correction at the shoulder. Thus, it is possible to use different eddy current corrections based on where the anatomy is located within the DSV. However, in the case of the variable FOV gradient coils of the present invention, it is advantageous to further allow for different eddy current corrections over the same anatomy or spatial position based on the eddy current characteristics of the base and correction coil combination for the selected DSV. Accordingly, in a preferred embodiment, an optional pre-emphasis correction circuit 44 is provided in which the precompensation of the gradient is selected based on the relative amounts of current in the base coil and correction coil. The precompensation is based on a priori knowledge of eddy current characteristics over the entire DSV range and is modified based on the selected DSV and other factors. Shielding can reduce the eddy current effects by reducing the coupling between the transient current and the structures in which the eddy currents are induced. However, even in the preferred well-shielded embodiments, eddy current corrections are preferably employed, especially for very sensitive imaging techniques such as fat saturation, fast spin echo, echo planar imaging, and the like.

A preferred method of designing a variable DSV coil system of the present invention includes obtaining a correction coil current distribution by subtraction of current distributions for a first DSV (e.g., 35 cm) coil design and a second DSV (e.g., 50 cm) coil design, each initially designed to yield a selected gradient strength (e.g., about 27 mT/m). For example, the base coil continuous current distribution is that which produces a useful imaging volume of 35 cm DSV. The correction coil continuous current distribution represents the current distribution which, when added at full strength to that of the base coil, yields a useful imaging volume of 50 cm DSV. The correction coil produces substantially zero first-order gradient field. Rather, only third, fifth, and higher order "correction" terms are produced. Applying less than the full current to the correction coil results in a partial correction increasing the useful DSV to be larger than 35 cm but less than 50 cm.

Figure 2:
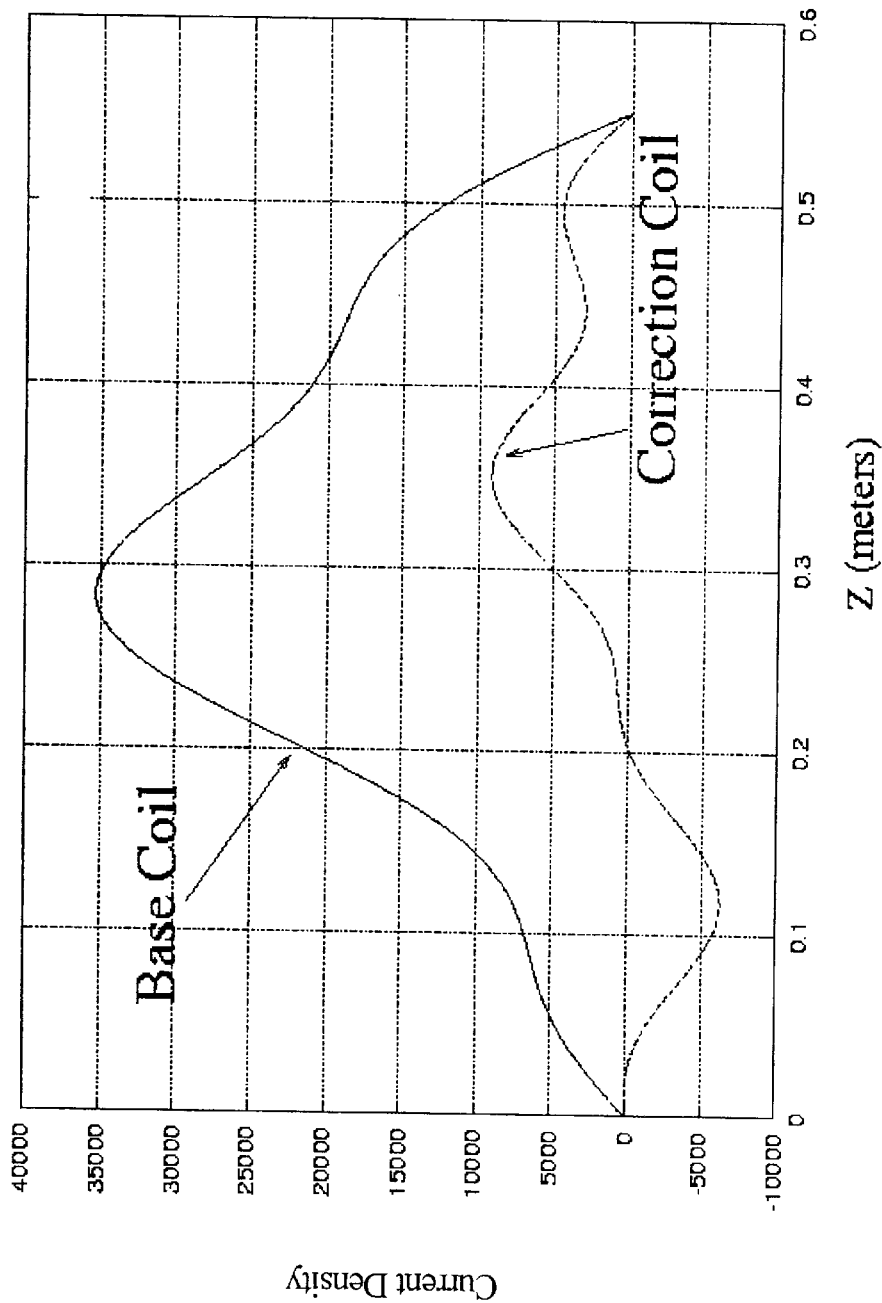
FIG. 2 is a graph of the $J_\phi$ component of the continuous current distributions for primary z-gradient base and correction coils of the present invention.
Figure 3:
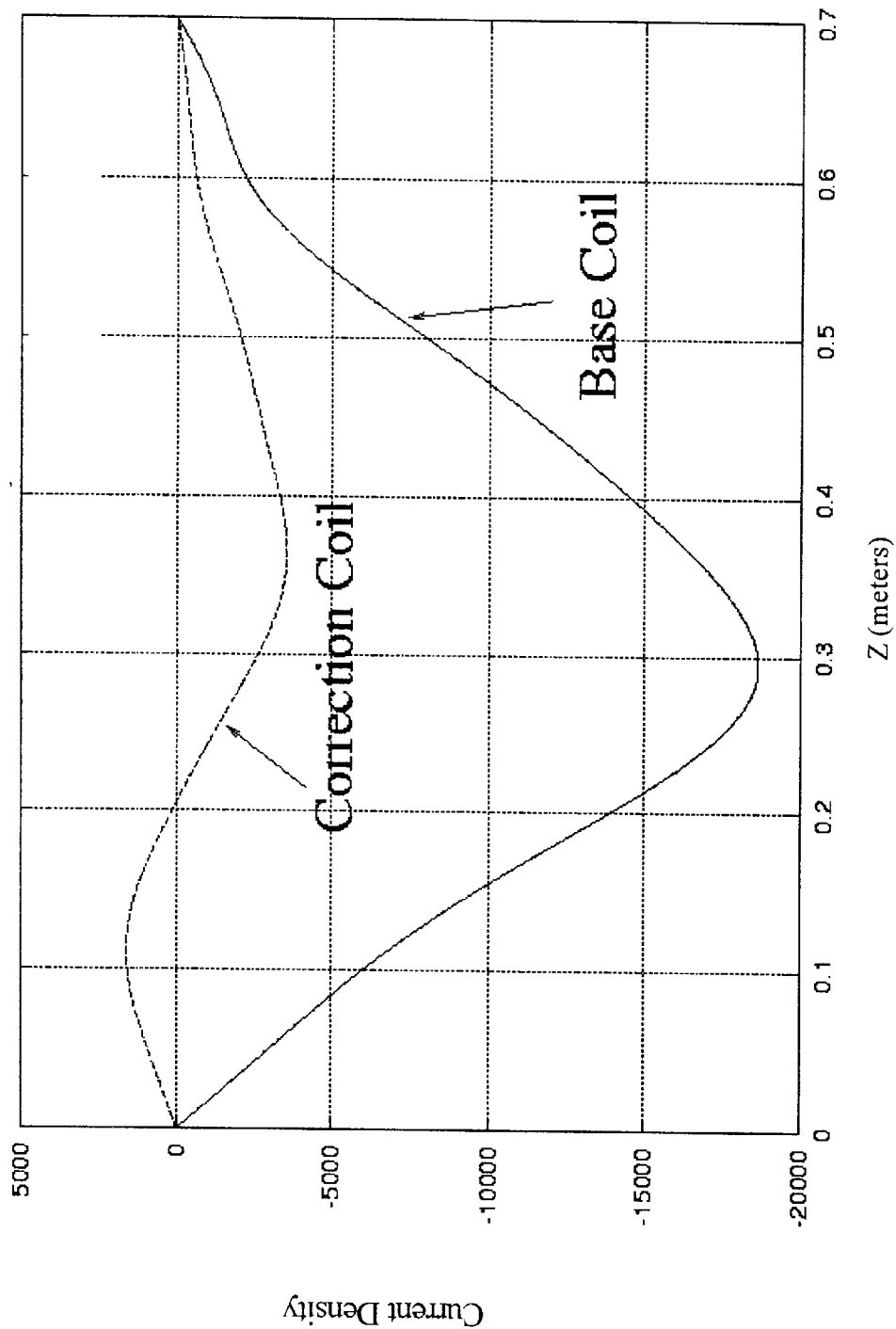
FIG. 3 is a graph of the $J_\phi$ component of the continuous current distributions for z gradient secondary (shield) base and correction coils of the present invention.

The continuous current distributions for an exemplary primary z-gradient base and correction coil combination is shown in FIG. 2 and the continuous current distributions for the secondary z gradient (shield) base and correction coils are shown in FIG. 3. For ease of illustration, the continuous current for the base coil is for a 28 mT/m gradient strength, although in practice one would scale up the base coil current distribution before discretizing to achieve the required base coil peak strength, e.g., 50 mT/m. The correction coil continuous currents shown are those which produce a 50 cm DSV when added to the base coil when the base coil is operated at 28 mT/m.

Figure 4:
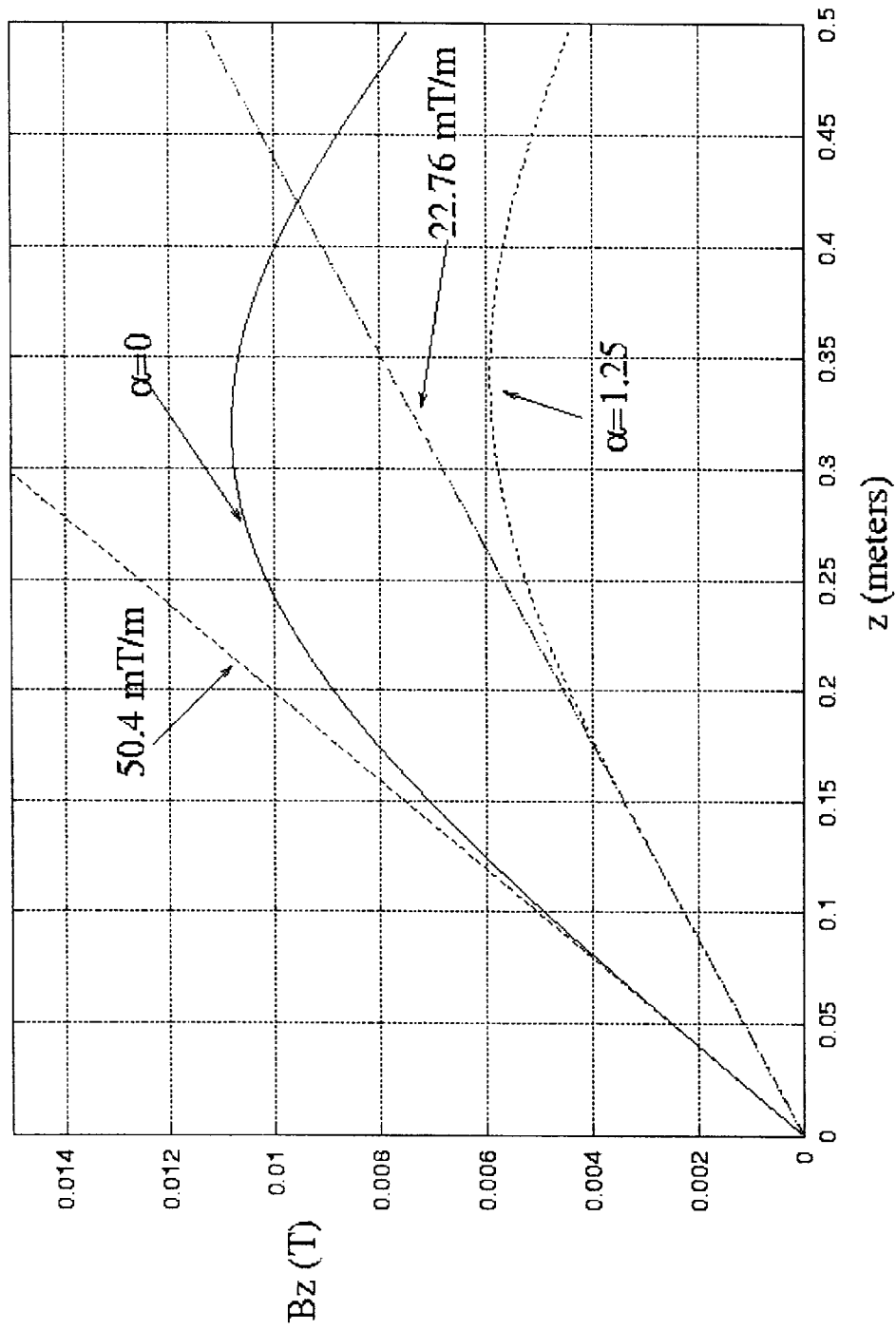
FIG. 4 is a graph of the $B_z$ magnetic field component of the z gradient as a function of z at $\rho=0$ for two extreme cases ($\alpha=0$ and $\alpha=1.25$). Note that $\alpha$ is a parameter relating to the amount of correction coil current, where $\alpha=0$ corresponds to zero correction current.
Figure 5:
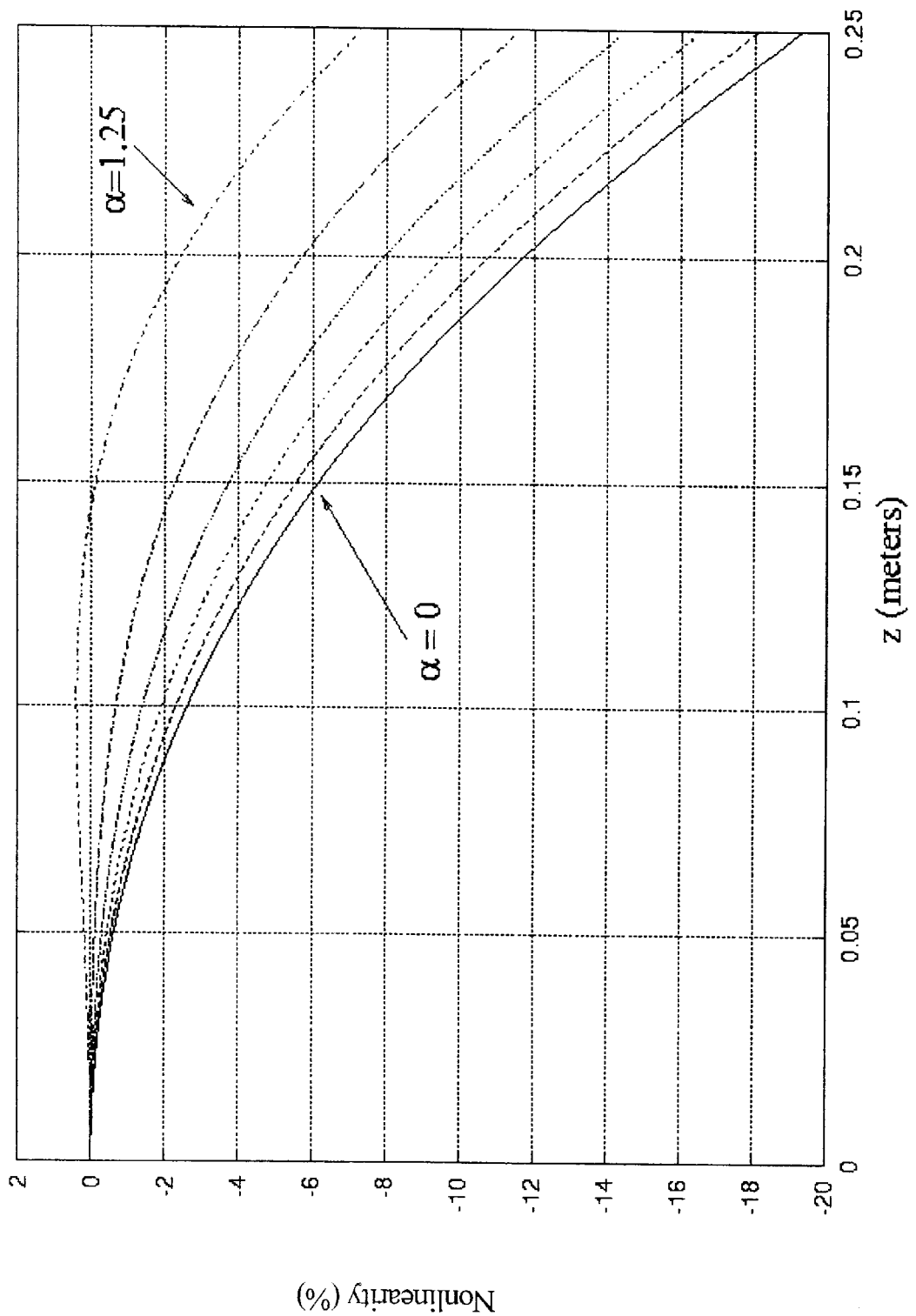
FIGS. 5 and 6 show the variations in the linearity and uniformity, respectively, of the $B_z$ magnetic field component for the z-gradient coil of the present invention for different alpha values.
Figure 6:
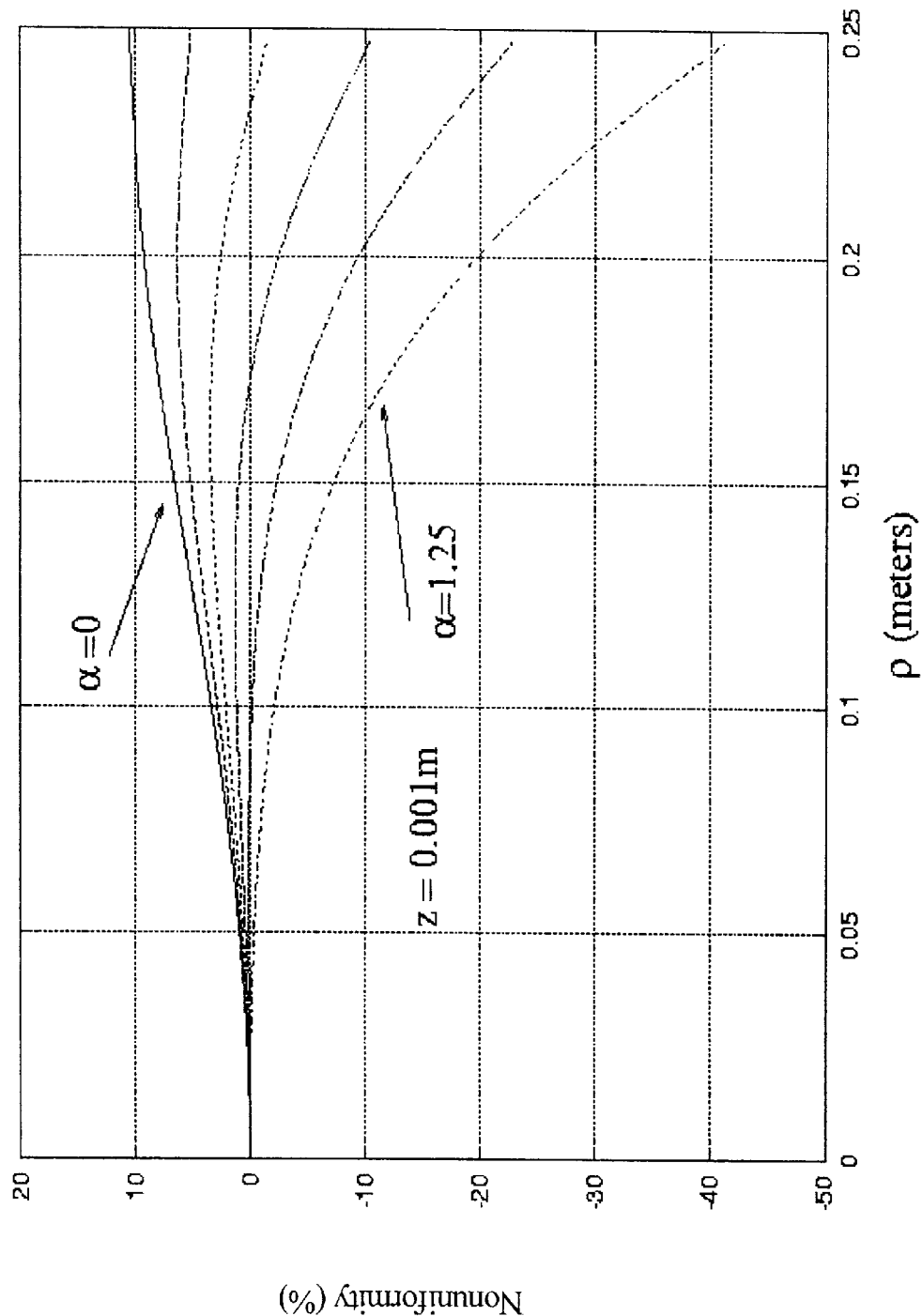

FIGS. 4–6 show: (1) the variation of the $B_z$ field, (2) the gradient field non-linearity in percent, and (3) the gradient field non-uniformity in percent, respectively, as a function of the amount of correction coil current added to the base coil current represented by the parameter $\alpha$. This demonstrates how the useful imaging volume can be expanded by increasing $\alpha$ or contracted by decreasing $\alpha$. A method for scaling the amounts of correction and base coil current is represented in equation form as:

$$I_{correction\ coil} = \alpha * I@28\ mT/m;\ I_{base\ coil} = (1-\alpha)[I@50\ mT/m - I@28\ mT/m] + I@28\ mT/m.$$

FIG. 4 illustrates two extreme cases of $B_z$ vs. z, namely, $\alpha=0$ and $\alpha=1.25$. FIGS. 5 and 6 show the linearity and uniformity, respectively, for the z-gradient coil with different alpha values. The results shown in FIGS. 4–6 for the z-gradient coils are summarized in TABLE 1.

TABLE 1

| α | Gz (mT/m) | I base coil (A) | I correction coil (A) | DSV (cm) |
|---|---|---|---|---|
| 0.0 | 50.40 | 475.93 | 0.0 | 40.0 |
| 0.25 | 44.87 | 423.58 | 16.25 | 42.5 |
| 0.5 | 39.34 | 371.22 | 32.50 | 45.0 |
| 0.75 | 33.81 | 318.87 | 48.75 | 47.5 |
| 1.0 | 28.28 | 266.52 | 65.00 | 50.0 |
| 1.25 | 22.76 | 214.16 | 81.25 | 52.5 |

Figure 7:
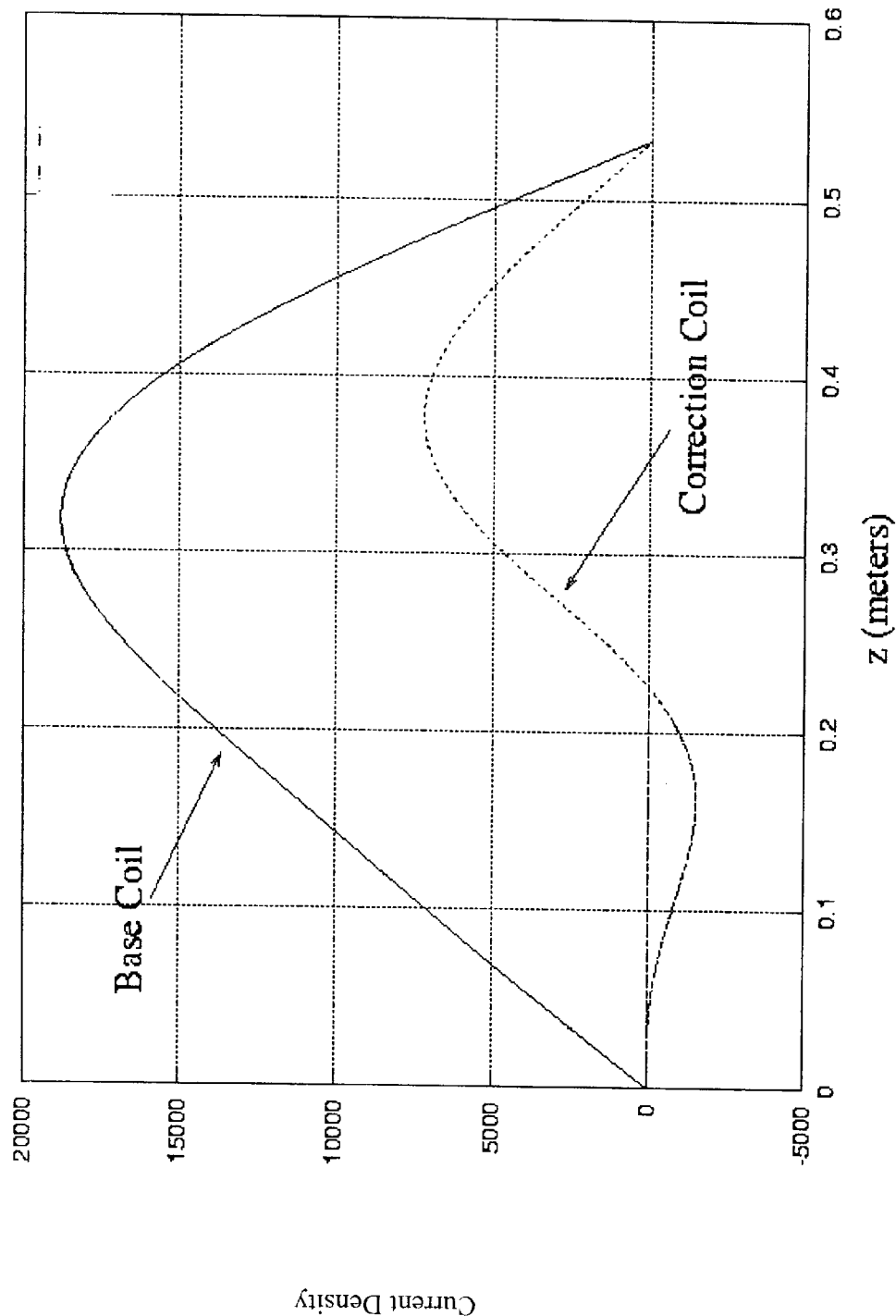
FIG. 7 is a graph of the $J_z$ component of the continuous current distribution on exemplary x-gradient base and correction primary coils of the present invention.
Figure 8:
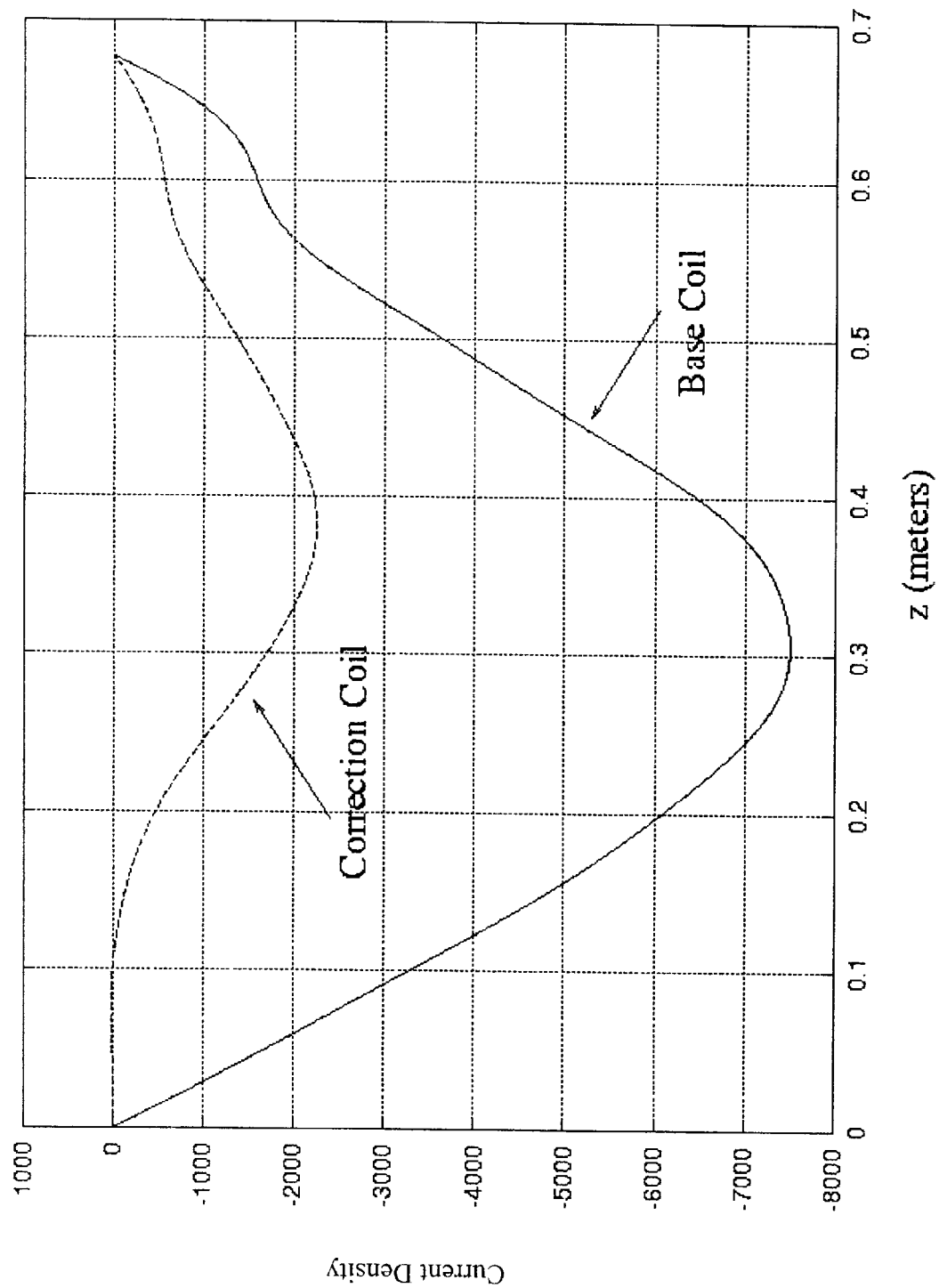
FIG. 8 is a graph of the $J_z$ component of the continuous current distribution on exemplary x-gradient secondary (shield) base and correction coils of the present invention.

FIG. 7 illustrates exemplary primary x-gradient base and correction coils, and FIG. 8 illustrates exemplary secondary x gradient (shield) base and correction coils. FIGS. 7 and 8 show continuous current distributions Jz based on a 27 mT/m gradient strength.

Figure 9:
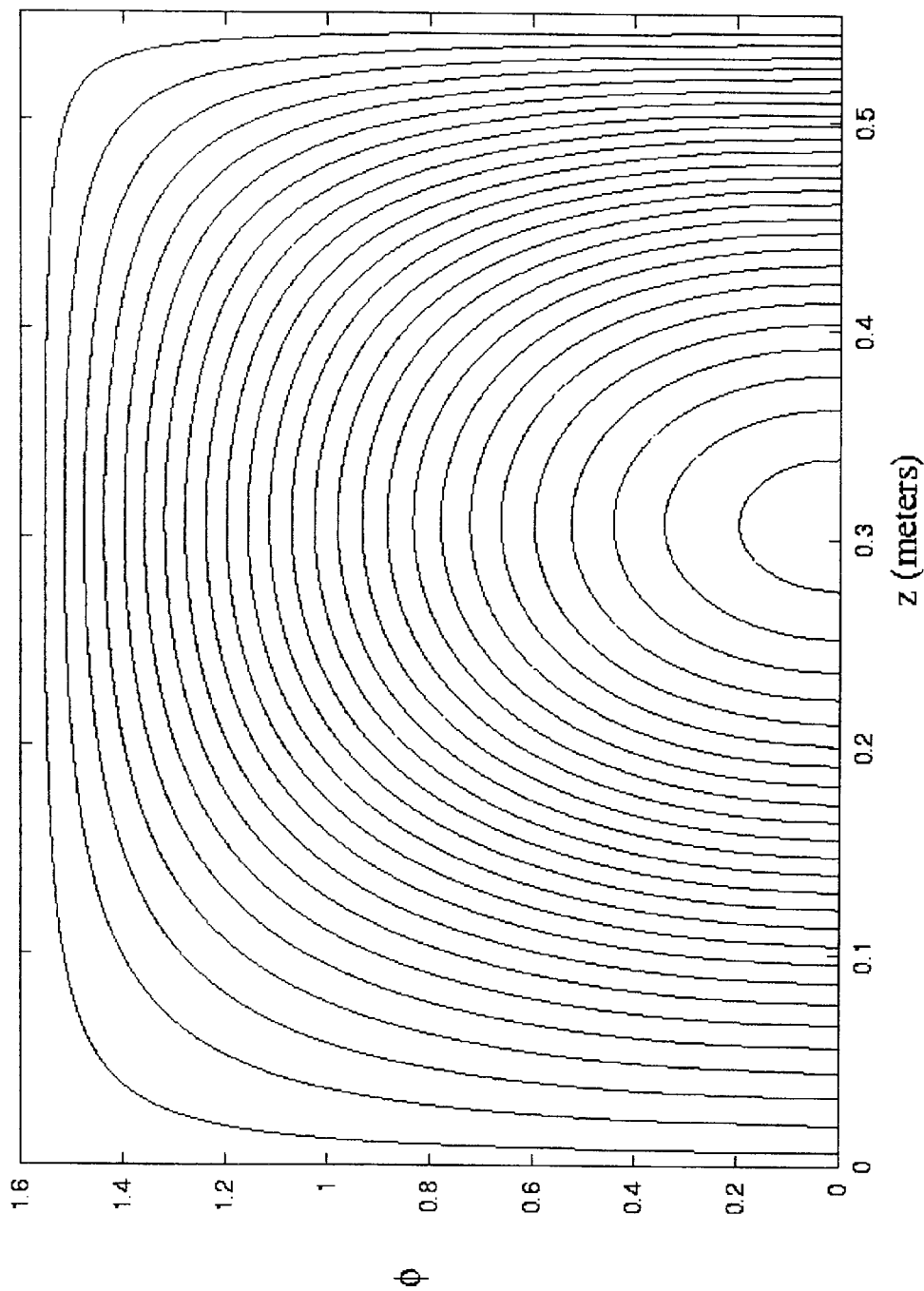
FIGS. 9 and 10 show discrete current patterns on the base primary and secondary x-gradient coils, respectively.
Figure 10:
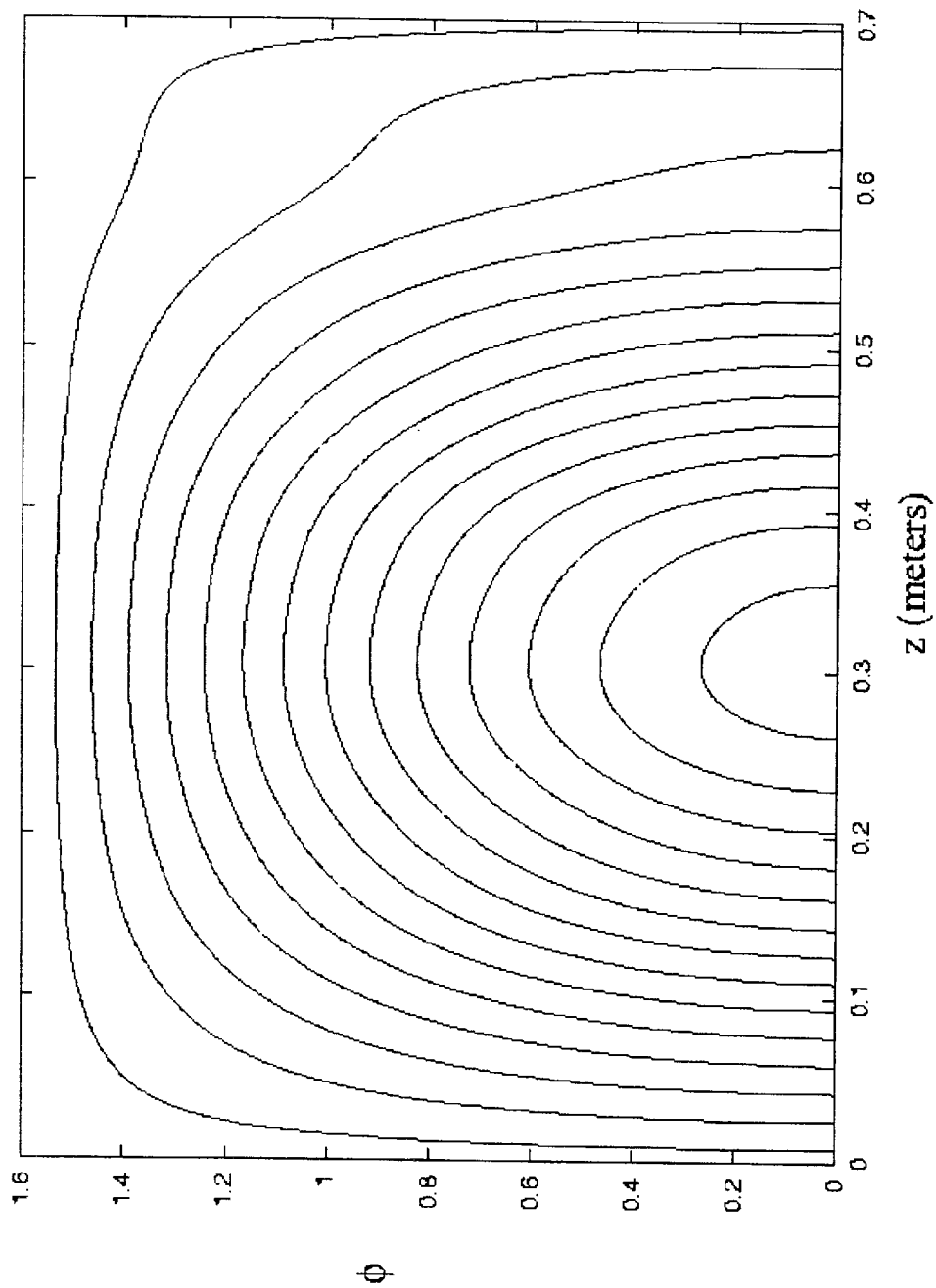
Figure 11:
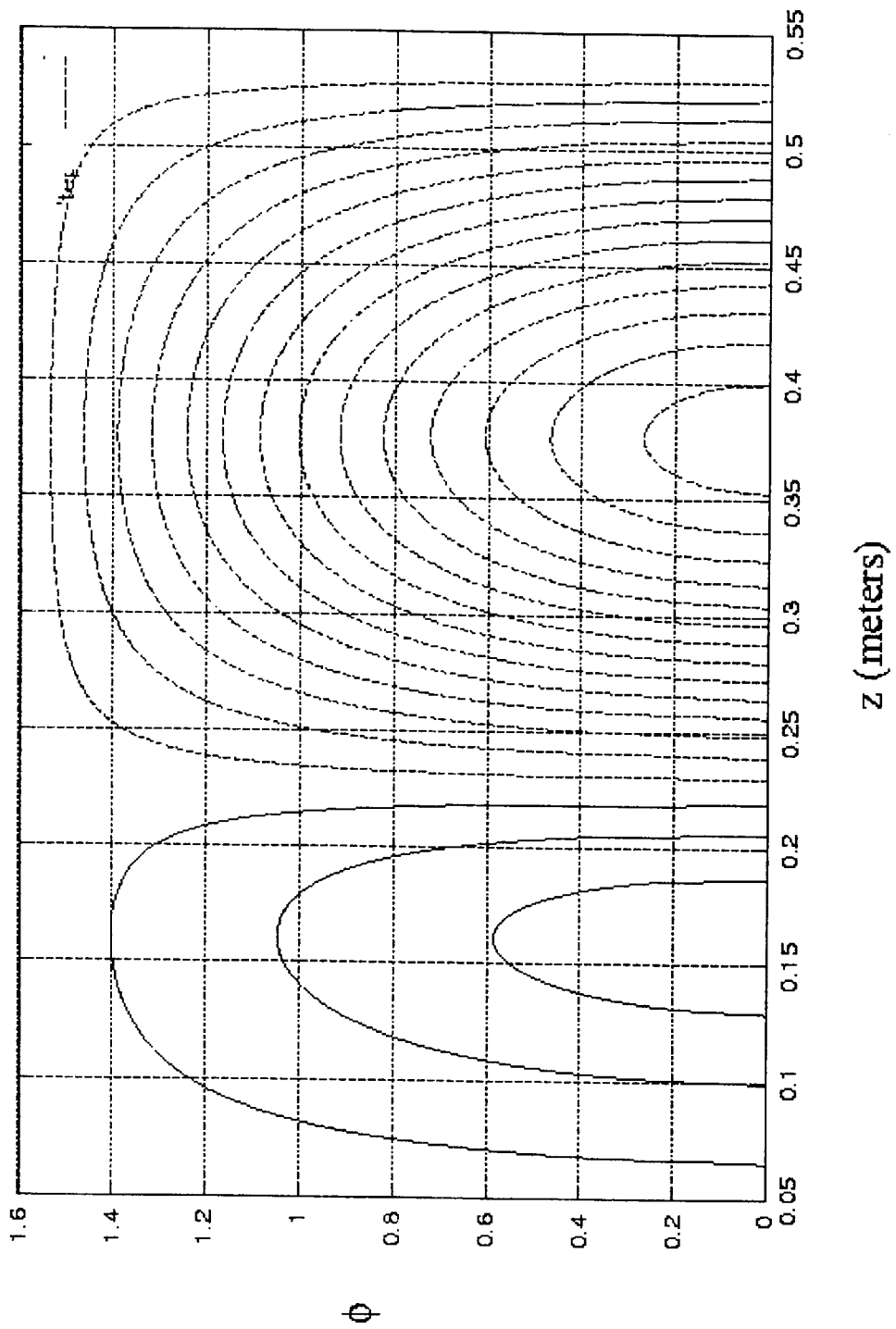
FIGS. 11 and 12 show discrete current patterns on the correction primary and secondary x-gradient coils, respectively.
Figure 12:
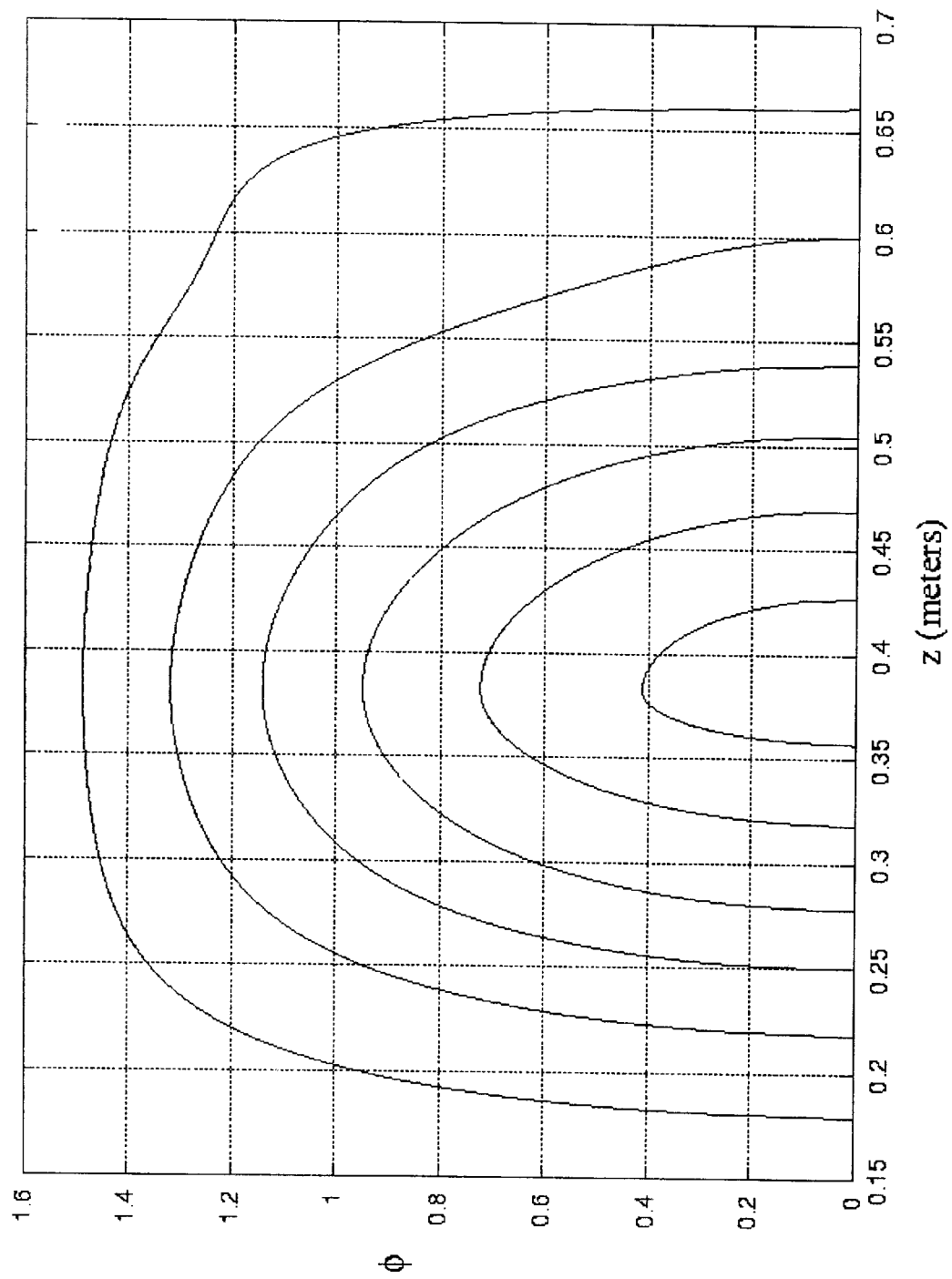

Referring now to FIGS. 9–12, there are shown the discrete coil centroid patterns for an example discretization of the x-gradient base and correction coils, both primary and secondary for each. FIGS. 9 and 10 show the current patterns on the base primary and secondary coils, respectively. FIGS. 11 and 12 show the current patterns on the correction primary and secondary coils, respectively. For the primary coil, a discretization which gives 50 mT/m for 487 A was used. It is to be understood that when the base coil is operated at 27 mT/m, or 264 A, the addition of the full correction coil will yield a 50 cm DSV at 27 mT/m. The correction coil current for the correction coil discretization used in the illustrated example correspondingly is 175 A.

Figure 13:
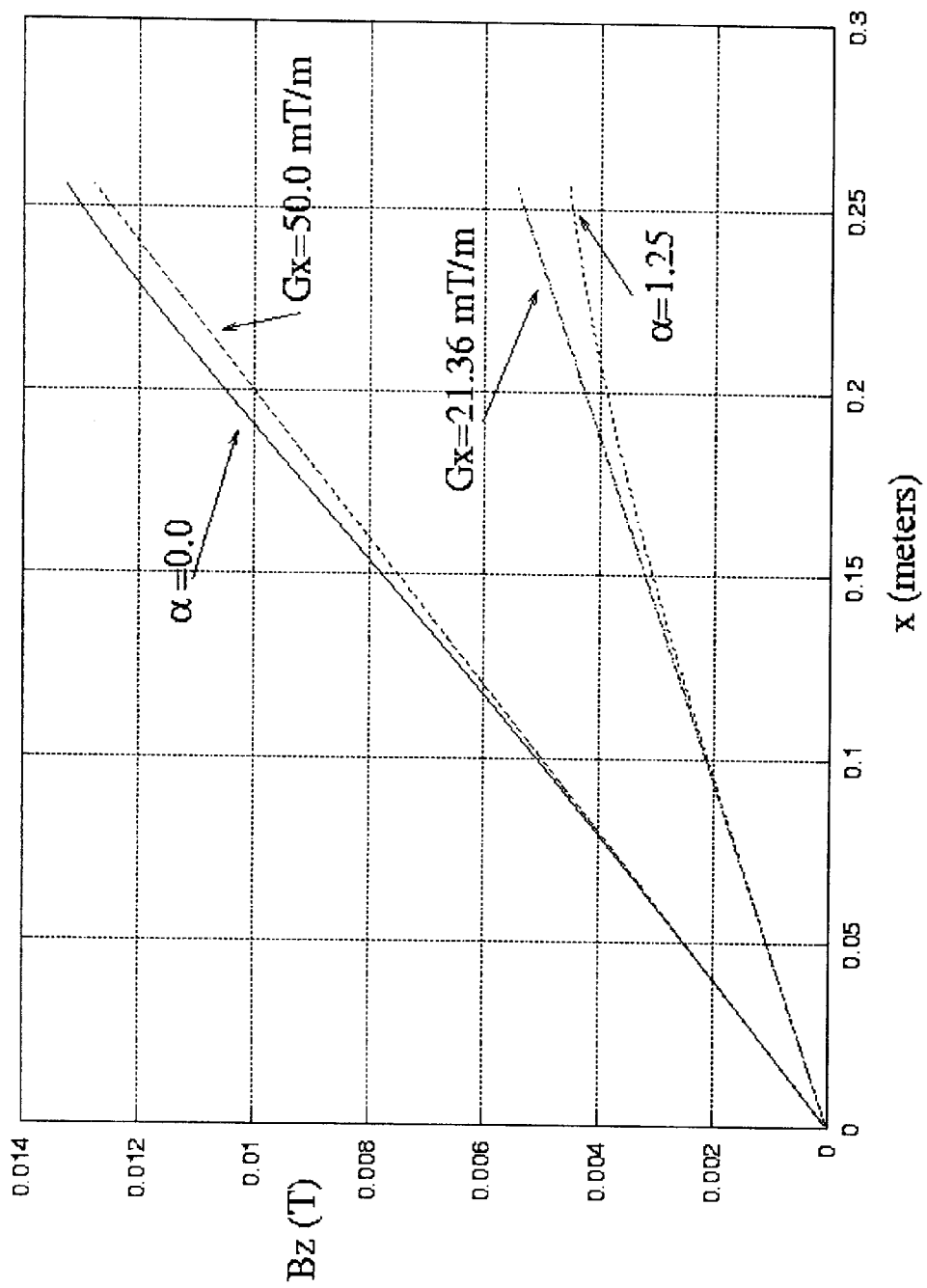
FIG. 13 a graph of the $B_z$ magnetic field component of the x gradient as a function of x at z=0 and $\phi=0$ for two extreme cases ($\alpha=0$ and $\alpha=1.25$).
Figure 14:
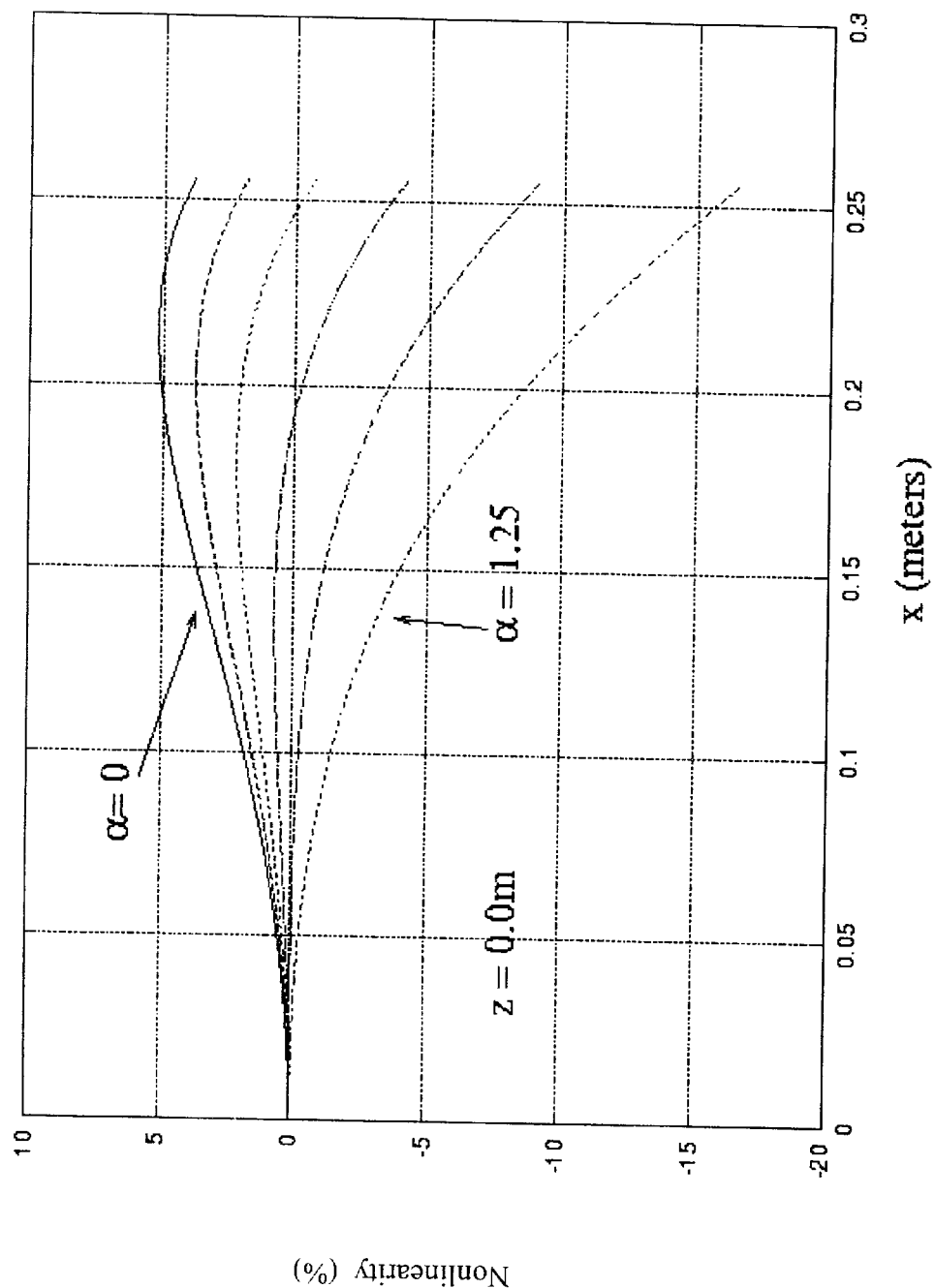
FIGS. 14 and 15 show variations in the linearity and uniformity, respectively, of the $B_z$ magnetic field component of the x-gradient coil for different alpha values.
Figure 15:
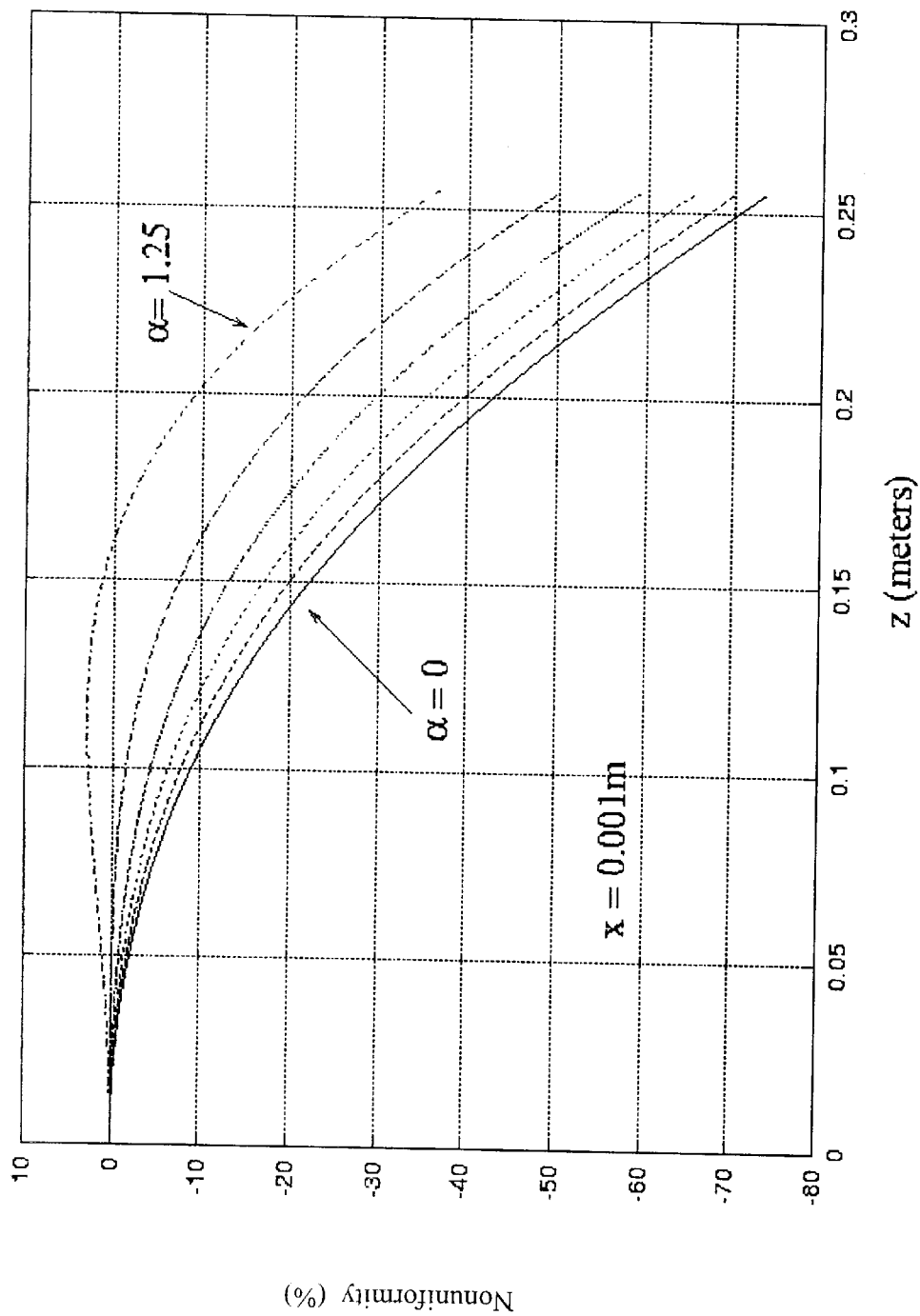

FIGS. 13–15 show: (1) the variation of $B_z$ field, (2) the gradient field non-linearity in percent, and (3) the gradient field non-uniformity in percent, respectively, as a function of the amount of correction coil current added to the base coil current ($\alpha$). In this manner, the useful imaging volume can be expanded by increasing a or contracted by decreasing $\alpha$. Of particular note is the improvement in uniformity along the z axis as $\alpha$ is increased. As described above by way of reference to the z-gradient case, a method of scaling the amount of correction and base coil current can be represented by the following equations:

$$I_{correction\ coil} = \alpha * I@27\ mT/m\ I_{base\ coil} = (1-\alpha)[I@50\ mT/m - I@27\ mT/m] + I@27\ mT/m.$$

FIG. 13 shows two extreme cases of $B_z$ vs. x, namely $\alpha=0$ and $\alpha=1.25$. FIGS. 14 and 15 show the linearity and uniformity, respectively, for the x-gradient coil with different alpha values. The results for the x-gradient coils are shown in TABLE 2.

TABLE 2

| α | GZ (mT/m) | I base coil (A) | I correction coil (A) | DSV (cm) |
|---|---|---|---|---|
| 0.0 | 50.00 | 487.69 | 0.0 | 40.0 |
| 0.25 | 44.27 | 431.83 | 52.95 | 42.5 |
| 0.5 | 38.54 | 375.96 | 85.91 | 45.0 |
| 0.75 | 32.82 | 320.10 | 128.86 | 47.5 |
| 1.0 | 27.09 | 264.23 | 171.81 | 50.0 |
| 1.25 | 21.36 | 208.37 | 214.76 | 52.5 |

The design of the y-gradient coil assembly receives the identical treatment as that of the x-gradient coil assembly merely rotated 90° about a central axis. While the adjustable coil system has been described by way of reference to the preferred embodiments, it is to be appreciated that various other options and configurations are also contemplated. For example, the present invention has been described primarily in reference to the well-shielded case in which each of the base and correction coils are accompanied by a corresponding shield coil. However, both coils could be unshielded. Alternately, one of the base and correction coil could be shielded and the other not. Also, gradient coil assemblies of various sizes, lengths, and geometric configurations may be designed to meet the constraints of numerous application. The base and correction coils may be of equal length or of different lengths. Likewise, in the preferred embodiments, the currents in the base and correction coils are scalable so as to produce a continuously variable DSV. However, a discretely variable imaging DSV is also contemplated. For example, the coils may be designed such that when driven in series they produce DSV2 and when the base coil is driven alone it produces DSV1, wherein DSV2 is greater than DSV1, such that these are the only two modes of operation. In a still further embodiment, the base coil can be designed to provide a useful imaging volume DSV2 which is less than DSV1, wherein the correction coil is designed to reduce the size of the useful imaging volume from DSV2 to DSV1. Similarly, the base coil may be designed to provide useful imaging volume DSV1 which is less than DSV2, wherein the correction coil designed to increase the size of the useful imaging volume from DSV1 to DSV2. For ultra-high gradient strengths, two (or more) base coils can be provided, allowing double (or greater) the peak gradient strength for the base coil when the two base coils are switched in series. In an alternate embodiment, two base coils are used which sandwich a correction coil, and the correction coil is water-cooled directly through the conductor to allow efficient cooling of both base coils. The correction coil can have current reversals. Thus, even if the base primary coil has current flow in only one direction or sense, the correction primary coil can have current flow in both directions. Likewise, the correction shield coil can also have current reversals.

The invention has been described with reference to the preferred embodiments obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance imaging apparatus comprising:
   a main magnet system for generating a main magnetic field through an examination region;
   a radio frequency coil disposed adjacent the examination region for transmitting radio frequency signals into the examination region and selectively exciting dipoles disposed therein;
   a radio frequency transmitter for driving the radio frequency coil;
   a receiver which receives magnetic resonance signals from resonating dipoles within the examination region;
   an image processor which reconstructs an image representation from the received magnetic resonance signals for display on a human readable display; and
   a gradient coil assembly for generating magnetic field gradients across the main magnetic field, the gradient coil assembly including:
      a base gradient coil set including a base primary coil and a base shield coil disposed about the examination region including an array of conductive coil loops arranged such that a current density flowing thereon generates a first order magnetic field moment and higher order magnetic field moments that define magnetic field gradients which are substantially linear over a first useful imaging volume; and
      a correction gradient coil set including a correction primary coil and a correction shield coil disposed about the examination region including an array of conductive coil loops arranged such that a current density flowing thereon generates magnetic field gradients having substantially no first order moment, the correction gradient coil set producing third and higher order moments which combine with higher order terms of the base gradient coil set to produce magnetic field gradients which are substantially linear over a second useful imaging volume which is different from the first useful imaging volume when the correction gradient coil set is used in combination with the base gradient coil set, the change between the first and second useful imaging volume being caused by using a combination of the base and correction gradient coil sets.

2. The apparatus of claim 1, wherein the base gradient coil set and the correction gradient coil set are each separately shielded, the separate shielding substantially suppressing eddy currents produced by the gradient coil assembly over a range of second useful imaging volumes corresponding to a range of current densities flowing on the correction gradient coil set.

3. The apparatus of claim 1, further comprising an amplifier for supplying current to the base and correction coil sets.

4. The apparatus of claim 1, wherein the base coil set and the correction coil set occupy different radial positions about the examination region.

5. The appparatus of claim 1, further comprising one or both of:
   an image distortion correction means for correcting a reconstructed image representation in accordance with preidentified spatially mapped nonuniformities in the magnetic field gradients, the spatially mapped nonuniformities varying in accordance with a selected imaging volume; and
   a pre-emphasis correction means which compensates for distortions in a gradient energization profile attributable to eddy currents induced by the gradient energization profile, the pre-emphasis correction adaptive to a selected imaging volume.

6. The apparatus of claim 1, wherein the second useful imaging volume is larger than the first useful imaging volume.

7. A magnetic resonance imaging apparatus including:
   a main magnet system for generating a main magnetic field through an examination region;
   a radio frequency coil for transmitting radio frequency signals into the examination region and selectively exciting dipoles disposed therein;
   a radio frequency transmitter for driving the radio frequency coil;
   a receiver which receives magnetic resonance signals from resonating dipoles within the examination region;
   an image processor which reconstructs an image representation from the received magnetic resonance signals; and
   a gradient coil assembly for generating magnetic field gradients across the main magnetic field, the gradient coil assembly including:
      a base gradient coil set including base primary and shield coils disposed about the examination region including an array of conductive coil loops arranged such that a current density flowing thereon generates magnetic field gradients which are substantially linear over a first useful imaging volume, and
      a correction gradient coil set including correction primary and shield coils disposed about the examination region including an array of conductive coil loops arranged such that a current density flowing thereon generates magnetic field gradients which combine with magnetic field gradients generated by the base gradient coil set to produce combined magnetic field gradients which are substantially linear over a second useful imaging volume; and
   a means for continuously adjusting a current flow to at least the correction gradient coil, the second useful imaging volume being continuously variable in response to varying the amount of current supplied to one or both of the base coil set and the correction coil set.

8. The apparatus of claim 7, further comprising:

a user interface permitting selection of an imaging field of view; and a sequence controller automatically varying the amounts of current supplied the base coil set and the correction coil set in response to the selected field of view to produce magnetic field gradients which are substantially linear over a spatial extent substantially matching the selected field of view.

9. A gradient coil assembly for inducing a magnetic field gradient in an examination region of a magnetic resonance imaging apparatus, the gradient coil assembly comprising:

a shielded base gradient coil set including primary and shield coils disposed about the examination region including an array of conductive coil loops arranged such that a current density flowing thereon generates a base magnetic field gradient which includes a substantially linear region over a first imaging volume and nonlinear portions outside of the first imaging volume; and a shielded correction gradient coil set including primary and shield coils disposed about the examination region, the shielded correction gradient coil set being separately shielded from the shielded base gradient coil set, the correction gradient coil set including an array of conductive coil loops arranged such that a current density flowing thereon generates a correction magnetic field gradient that combines with the base magnetic field gradient to produce a combined magnetic field gradient which is substantially linear over a second imaging volume which encompasses the first imaging volume and at least some of the non-linear portions of the first magnetic field gradient.

10. A method of magnetic resonance imaging, comprising:

generating a temporally constant magnetic field through an examination region of a magnetic resonance imaging apparatus;

exciting and manipulating magnetic resonance in selected dipoles in the examination region;

demodulating magnetic resonance signals received from the examination region;

reconstructing the demodulated resonance signals into an image; and inducing gradient magnetic fields across the temporally constant magnetic field with a gradient coil assembly comprising:

a base gradient coil set including base primary and shield coils disposed about the examination region including an array of conductive coil loops arranged such that a current density flowing thereon generates the substantially linear magnetic field gradients defining a first useful imaging volume; and a correction gradient coil set including correction primary and shield coils disposed about the examination region including an array of conductive coil loops arranged such that a current density flowing thereon generates substantially no linear magnetic gradient, the correction gradient coil set producing third and higher order and substantially no first order gradient, the third and higher order gradients combining with higher-order terms of the base gradient coil set to produce the substantially linear magnetic field gradients defining a second useful imaging volume which is different from the first useful imaging volume caused by using the correction gradient coil set in combination with the base gradient coil set.

11. The method of claim 10, further comprising:

continuously adjusting a current applied to the correction coil set to adjust the imaging volume.

12. The method of claim 10, wherein the step of inducing gradient magnetic fields includes:

applying a first current to the base coil set and a second current to the correction coil set to generate a combined gradient field having a substantially linear region; and the first and second currents selectively variable to selectively adjust the gradient strength and spatial extent of said substantially linear region.

13. The method of claim 12, wherein the first and second currents are selected in response to user input selecting an imaging field of view.

14. In a method of magnetic resonance imaging, a method of producing a target magnetic field gradient which is generally linear over a selected imaging volume, comprising:

selecting a first current in a base gradient coil to produce a first magnetic field gradient, the first magnetic field gradient being generally linear over a first useful imaging volume that is smaller than the selected imaging volume, the first magnetic field gradient increasing proportionally with the supplied current and substantially defining the target magnetic field gradient within the first useful imaging volume; and selecting a second current in a correction coil to produce a second magnetic field gradient, the second magnetic field gradient having substantially no first order moment, the second magnetic field gradient combining with the first magnetic field gradient to extend the linear region from the first useful imaging volume to the selected imaging volume.

15. The method of claim 14, further comprising:

simultaneously supplying the first current to the base gradient coil and the second current to the correction gradient coil, the quantity of current supplied to each coil being continuously adjustable to produce a magnetic field gradient which is generally linear over a continuous range of imaging volumes.

16. The method of claim 14, further comprising:

applying current pulses to the base and correction gradient coils in variable amounts to generate a plurality of magnetic field gradients which are substantially linear over a plurality of useful imaging volumes and which span a range of useful imaging volumes obtainable by combining the base and correction gradient coils; and calculating resultant gradient field nonuniformities in each of the plurality of imaging volumes.

17. The method of claim 16, further comprising:

computing eddy current corrections for the range of useful imaging volumes based on each of the calculated gradient field nonuniformities;

reconstructing an image representation of a selected imaging volume;

selecting eddy current corrections which correspond to the selected imaging volume; and correcting the reconstructed image representation with the selected eddy current corrections.

18. Method of claim 16, further comprising:

based on the applying of currents, measuring eddy current effects for the range of useful imaging volumes to calculate a plurality of pre-emphasis corrections; and applying one of the pre-emphasis correction which corresponds to the selected imaging volume to the current pulses.

19. A method of designing a gradient coil system for a magnetic resonance imaging system having a variable useful imaging diameter spherical volume, comprising:

designing a base coil that produces a first magnetic field gradient that is generally linear over a first imaging volume;

designing a correction coil that produces a second magnetic field gradient having non-zero moments of orders higher than first order and substantially zero first order moment, the first and second magnetic field gradients combining to produce a third magnetic field gradient that is generally linear over a second imaging volume that is different from the first imaging volume.

20. The method of claim 19, wherein the step of designing a correction coil includes:

calculating a first current distribution that produces the first magnetic field gradient from the base coil or a combination of the base and correction coils;

calculating a second current distribution that produces the third magnetic field gradient from the combination of the base and correction coils; and subtracting the first current distribution from the second current distribution to calculate a third current distribution defining the correction coil current distribution.

* * * * *